United States Patent
Willis et al.

(10) Patent No.: US 6,819,553 B2
(45) Date of Patent: Nov. 16, 2004

(54) PROTECTION ELEMENT FOR AN EMI REDUCTION ELEMENT

(75) Inventors: Clifford B. Willis, Tracey, CA (US); Vincent P. Hileman, Fremont, CA (US); Rob J. Lajara, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 6 days.

(21) Appl. No.: 10/277,338

(22) Filed: Oct. 21, 2002

(65) Prior Publication Data

US 2004/0075972 A1 Apr. 22, 2004

(51) Int. Cl.⁷ .............................. G06F 1/16
(52) U.S. Cl. .................. 361/683; 361/679; 361/687
(58) Field of Search .................. 361/679, 683–687

(56) References Cited

U.S. PATENT DOCUMENTS 6,524,120 B2 * 2/2003 Zhao ........................ 439/95
6,529,383 B1 * 3/2003 Barringer et al. ........... 361/754

* cited by examiner

Primary Examiner—Yean-Hsi Chang
(74) Attorney, Agent, or Firm—Meyertons Hood Kivlin Kowert & Goetzel, P.C.; B. Noël Kivlin

(57) ABSTRACT

An EMI reduction element and a protection element are provided with an electrical component. The electrical component has a distal end, and the EMI reduction element has a height and a distal side. The EMI reduction element is secured to the electrical component. The protection element includes a middle portion that has a maximum height. The maximum height is based on the height of the EMI reduction element, and is preferably about 30% to about 50% of the reduction element height. The protection element is secured to the electrical component and is positioned adjacent to the EMI reduction element so that the middle portion is closer to the distal end of the electrical component than the distal side of the EMI reduction element. The protection element protects the reduction element from being sheared and/or torn by walls of an enclosure that the electrical component can be inserted into.

20 Claims, 4 Drawing Sheets

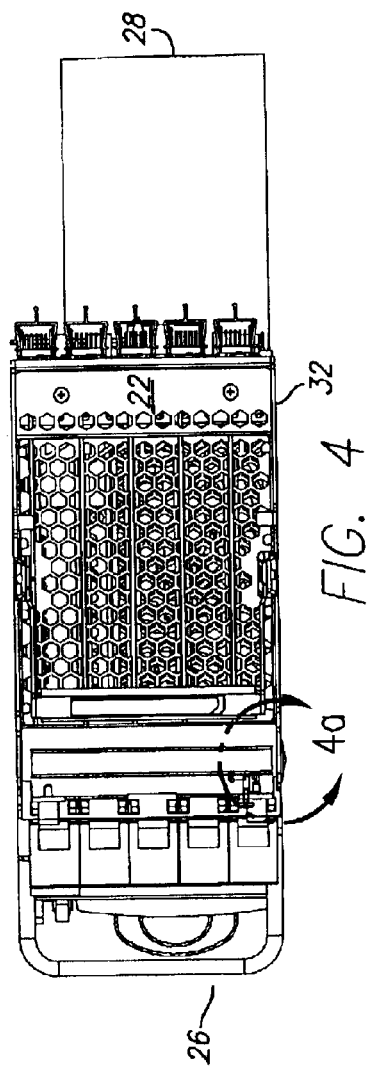
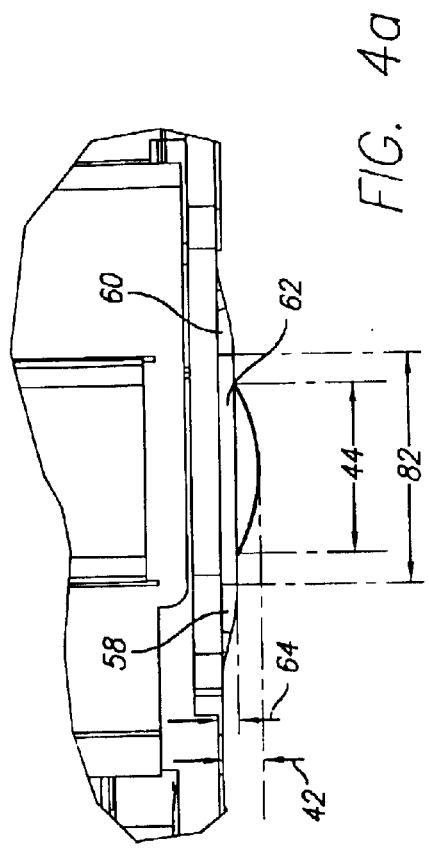
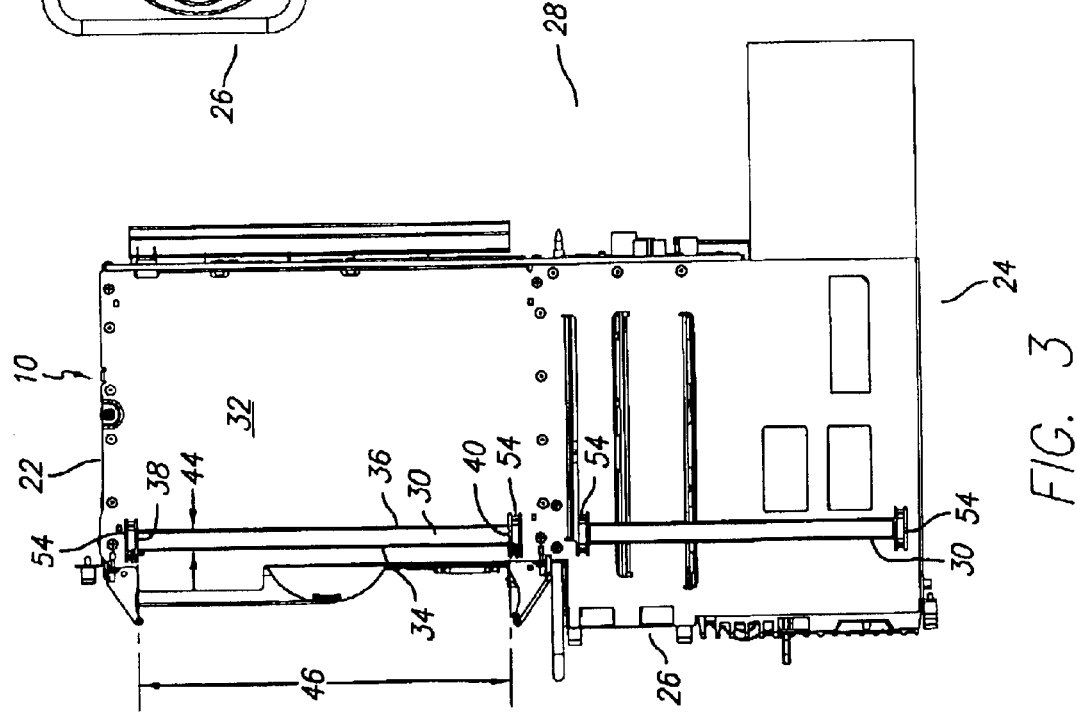
FIG. 4
FIG. 4a
FIG. 3

PROTECTION ELEMENT FOR AN EMI REDUCTION ELEMENT

BACKGROUND OF THE INVENTION

1. Field of the Invention

The present invention relates to an electrical assembly having an electromagnetic interference (EMI) reduction system and an electrical component, and also relates to the EMI reduction system, which has an EMI reduction element and a protection element.

2. Description of Related Art

Electrical components are oftentimes housed in enclosures, and the electrical components typically emit electromagnetic interference (EMI) that escapes the enclosures. The EMI that escapes from the enclosure oftentimes interferes with adjacent electrical components and can reduce the performance of the adjacent components. Examples of components that emit EMI include the CT 410 and CT 810 servers that are manufactured by Sun Microsystems, Inc. These servers are housed in an enclosure, such as the CT 1600 chassis, also manufactured by Sun Microsystems, Inc.

To address the issue of EMI escaping from the enclosures, reduction elements are secured to the electrical component. To adequately prevent EMI from escaping, the reduction elements should be grounded. Grounding is accomplished by having the reduction elements abut the walls of the enclosure. Thus, when the EMI reduction elements are properly grounded, the reduction elements prevent the EMI that is produced by the electrical component from escaping the enclosure. Although this addresses the problem of EMI escaping from the enclosure, it introduces another problem.

When the electrical components are inserted into and/or removed from the enclosure, walls of the enclosure oftentimes tear or shear off the reduction elements. This undesirable tearing requires new EMI reduction elements to be secured to the electrical components, resulting in extra man-hours and material cost to manufacture and/or maintain the electrical assembly.

Thus, there remains a need for an electrical assembly in which the EMI reduction element is not torn or sheared off of the electrical component to which the reduction element is secured, when the electrical component is inserted into and/or removed from an enclosure.

SUMMARY OF THE INVENTION

The present invention addresses the shortcomings of prior electrical assemblies by the use of a protection element. The protection element prevents the enclosure from tearing or shearing the reduction element when the electrical component is inserted into or removed from the enclosure.

One embodiment of the present invention includes an electrical component that has a distal end, and an EMI reduction element that has a height and a distal side. The EMI reduction element is secured to the electrical component. The embodiment also includes at least one protection element. The protection element includes a middle portion that has a maximum height. The maximum height is based on the height of the EMI reduction element, and is preferably about 30% to about 50% of the reduction element height. The at least one protection element is secured to the electrical component and is positioned adjacent to the EMI reduction element so that the middle portion is closer to the distal end of the electrical component than the distal side of the EMI reduction element.

In this manner, when the electrical component is inserted into the enclosure, walls of the enclosure first contact the middle portion of the protection element. The maximum height is based on the height of the reduction element so that the height is high enough to prevent tearing and/or shearing of the reduction element, but not too high to prevent the reduction element from contacting the enclosure. The protection element deflects the enclosure walls away from those portions of the reduction element that are secured to an outer surface of the electrical component. This prevents the undesirable tearing and shearing of the reduction element.

In another embodiment, the EMI reduction element also includes a proximal side, and the protection element is positioned axially adjacent to the reduction element so that the middle portion of the protection element is closer to the proximal and distal ends of the electrical component than the distal and proximal sides of the reduction element. In this manner, the enclosure will contact the protection element before the reduction element during both insertion and removal of the electrical component from the enclosure. Thus, the protection element will prevent tearing and shearing of the reduction element during both insertion and removal of the electrical component from the enclosure.

In yet another embodiment, the protection element also includes proximal and distal portions that are integral with the middle portion. The proximal portion and the distal portion each has a top edge that forms an angle between the top edge and an outer surface of the electrical component. In this manner, the height of the proximal and distal portions taper up from a smaller height, at ends of the proximal and distal portions, to the maximum height, at inner sections of the proximal and distal portions. This facilitates electrical component insertion and removal because, instead of an abrupt change in height, which can impede electrical component insertion and removal, the angled configuration allows the enclosure walls to slide up the distal portion during insertion, and to slide up the proximal portion during removal.

A more complete understanding of the electrical assembly will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 3 is a side view of an electrical component having an EMI reduction system secured thereto;

FIG. 4 is a top view of FIG. 3;

FIG. 4a is an enlarged view of a portion of FIG. 4;

DETAILED DESCRIPTION OF THE PREFERRED EMBODIMENT

The present invention pertains to an electrical assembly that includes an electromagnetic interference (EMI) reduction system and an electrical component. An EMI reduction system of the invention includes an EMI reduction element and a protection element. Pursuant to an embodiment of the invention, the EMI reduction element and the protection element are both secured to the electrical component. The electrical component is capable of emitting EMI, and is positioned within an enclosure. The EMI reduction element is positioned on the electrical component so that it reduces EMI emission from the electrical component to outside of the enclosure. The protection element is positioned on the electrical component so that the EMI reduction element is not damaged by the enclosure when the electrical component is inserted into and/or removed from the enclosure.

Figure 1:
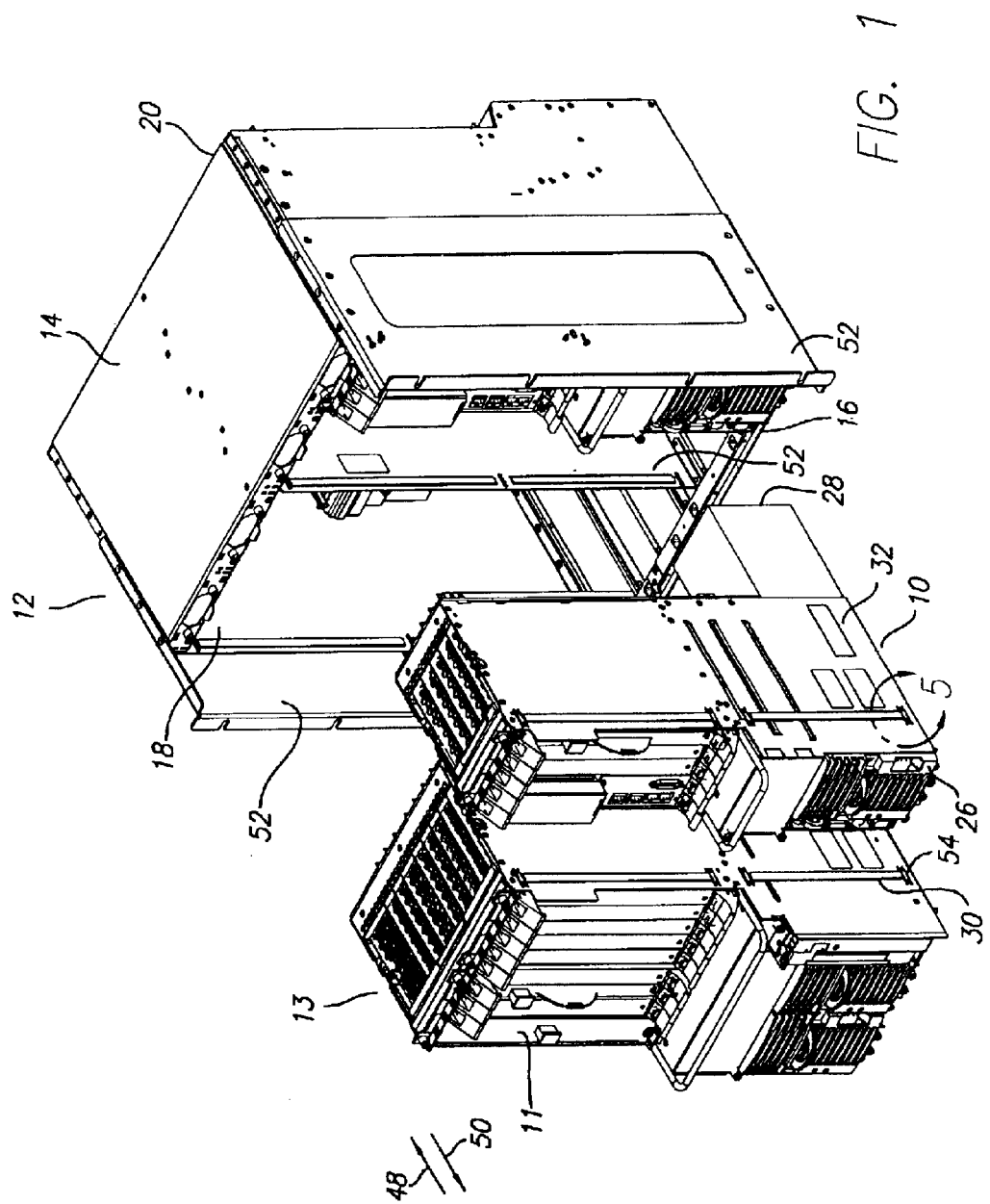
FIG. 1 is an isometric view of an electromagnetic interference (EMI) reduction system of the invention, an electrical component, and an enclosure.

Referring now to FIG. 1, the electrical component 10 can be any component that is capable of emitting EMI. Exemplary electrical components 10 include, but are not limited to, servers, such as the CT 410 and CT 810 servers manufactured by Sun Microsystems, Inc., and disk drives, such as disk drives used in the servers.

The enclosure 12 can be any enclosure that receives the electrical component 10. The enclosure 12 has first 14 and second 16 ends, and proximal 18 and distal 20 ends. The electrical component 10 also has first 22 and second 24 ends, and proximal 26 and distal 28 ends. Typically, the electrical component 10 is inserted into the enclosure 12 so that the distal end 28 of the electrical component 10 is in proximity to the distal end 20 of the enclosure 12. Note that although the electrical components 10 and enclosure 12 shown in FIG. 1 are horizontally orientated so that the distal end 28 of the electrical component 10 is inserted into the enclosure from left to right (direction shown by arrow 48), it should be appreciated that the scope and spirit of this invention encompasses electrical components and enclosures in a vertical orientation (not shown) where a distal end of the enclosure is inserted into the enclosure from top to bottom.

Figure 2:
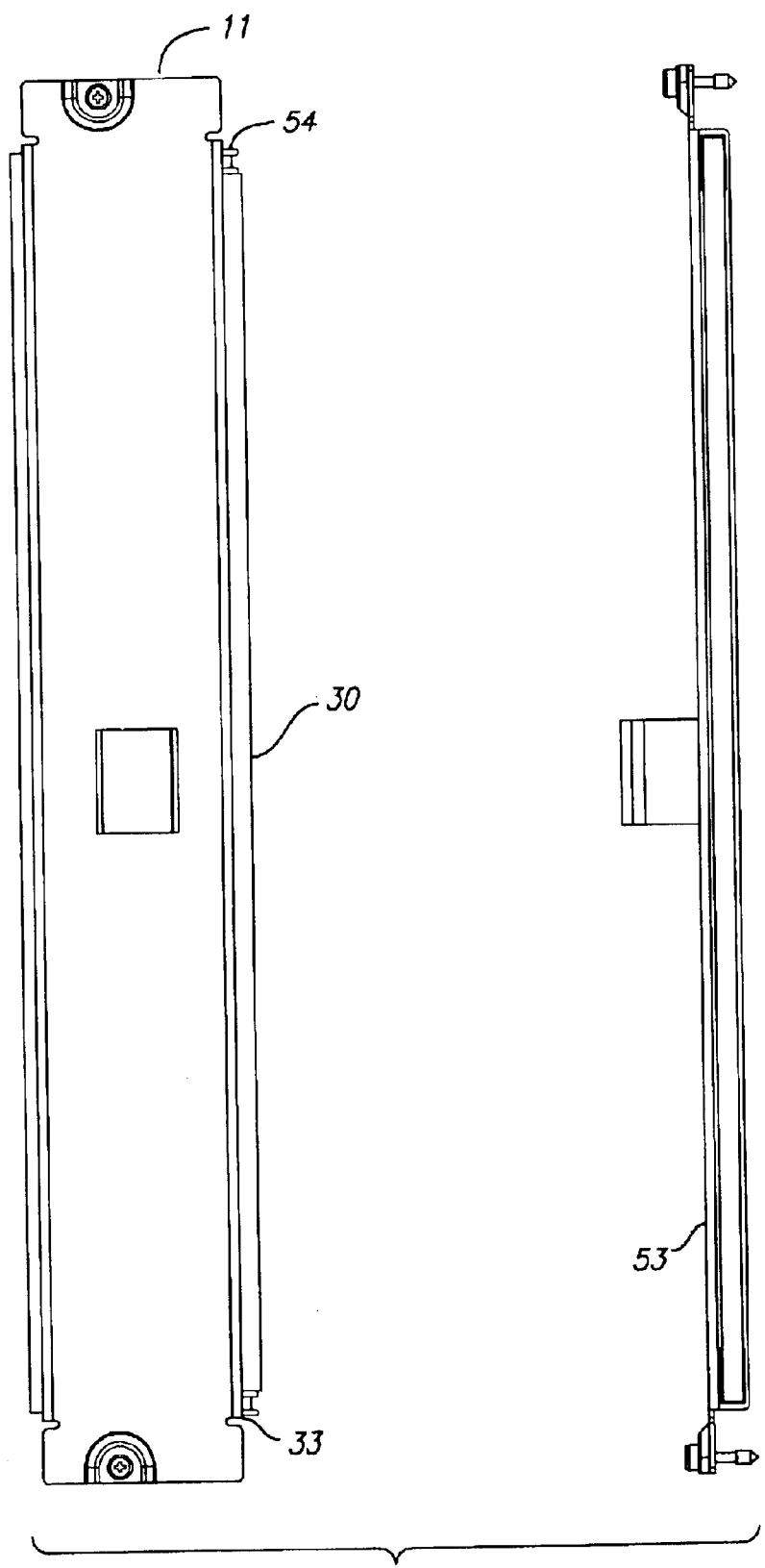
FIG. 2 is a front view of an enclosure wall and a portion of an electrical component having an EMI reduction system secured thereto.

Exemplary enclosures 12 include, but are not limited to, the CT 1600 chassis manufactured by Sun Microsystems, which receives servers, such as the CT 410 and/or the CT 810 servers. Other exemplary enclosures 12 include servers, such as the CT 810 server, which receives disk drives. Note that an enclosure 12 for one electrical component 10 may also comprise an electrical component 10 that is inserted into another enclosure 12. For example, FIGS. 1 and 2 show that a server 13, which is an enclosure 13 for an electrical component (i.e., the disk drive) 11, is also an electrical component 13 that is inserted into another enclosure (i.e., the chassis) 12.

As shown in FIG. 1, EMI reduction elements 30 are secured to outer surfaces 32 of the electrical components 10 and are positioned to reduce the amount of EMI, which is produced by the electrical components, that escapes the enclosure 12. (An outer surface 33 of the disk drive 11 type electrical component is shown in FIG. 2.) Typically, adhesion strips are formed on the EMI reduction element 30 and are used to secure and position the EMI reduction elements onto the electrical component 10. It should be appreciated that other known methods, such as the use of fasteners, may be used to secure and position the reduction elements 30 onto the electrical components 10.

The EMI reduction element 30 may be comprised of a variety of materials, such as, without limitation, foam having a conductive coating, conductive elastomers, or spring fingers. One type of acceptable EMI reduction element 30 having foam with coating are Soft-Shield 5000 Series products manufactured by Chomerics North America which is located at 77 Dragon Court, Woburn, Mass. 01888. One type of acceptable EMI reduction element 30 having spring fingers are Beryllium Copper Fingers manufactured by Tech-Etch Inc., which is located at 45 Aldrin Road, Plymouth, Mass. 02380. The EMI reduction elements 30 may also have a variety of cross-sectional shapes, such as, without limitation, "L" shapes, square shapes, and "D" shapes.

As shown in FIG. 3, the EMI reduction element 30 has proximal 34 and distal 36 sides, first 38 and second 40 sides, a height 42 (FIG. 4a), a width 44, and a length 46. The distal side 36 of the reduction element 30 is closer to the distal end 28 of the electrical component 10 than the proximal side 34 of the reduction element 30, and the proximal side 34 of the reduction element 30 is closer to the proximal end 26 of the electrical component 10 than the distal side 36 of the reduction element 30. The first side 38 of the reduction element 30 is closer to the first end 22 of the electrical component 10 than the second side 40 of the reduction element 30, and the second side 40 of the reduction element 30 is closer to the second end 24 of the electrical component 10 than the first side 38 of the reduction element 30.

In the preferred embodiment shown in FIG. 3, the EMI reduction element 30 is substantially rectangular-shaped. The width 44 of the preferred embodiment is defined by the distance between the proximal 34 and distal 36 sides, and the length 46 of the preferred embodiment is defined by the distance between the first 38 and second 40 sides. As shown in FIGS. 3 and 4a, the exemplary EMI reduction element 30 is a beryllium copper finger having a "D" shaped cross-section, and is positioned closer to the proximal end 26 of the electrical component 10 than the distal end 28 of the electrical component 10.

Note that the reduction element 30 can have shapes other than the rectangular shape of the embodiment, and in embodiments where the proximal 34 and distal 36 sides are not parallel to one another, the reduction element 30 can have differing widths 44 at different points along the proximal 34 and distal 36 sides of the reduction element 30. Likewise, in embodiments where the first 38 and second sides 40 are not parallel to one another, the reduction element 30 can have differing lengths 46 at different points along the first 38 and second 40 sides of the reduction element 30.

EMI reduction is improved when the reduction element 30 is grounded properly. The EMI reduction element 30 is grounded by contacting the enclosure 12, and thus provides improved EMI reduction. In one embodiment, the EMI reduction element 30 has a height 42 (FIG. 4a) that facilitates contact between the EMI reduction element and the enclosure 12. Thus, the height 42 of the EMI reduction element 30 is typically dependent on the design of the electrical component 10 and the enclosure 12. For example, the farther the electrical component 10 is spaced from the enclosure 12 when positioned within the enclosure, the greater the height 42 that the EMI reduction element 30 should be to allow for contact between the reduction element and the enclosure.

As shown in FIG. 1, when the electrical component 10 is inserted into and/or removed from the enclosure 12 (direction shown by arrows 48 and 50), the reduction element 30 is susceptible to shearing or tearing caused by undesirable contact with walls 52 of the enclosure 12. (A wall 53 of the server 13 is shown in FIG. 2. The server 13 is both an enclosure for the disk drive 11 and is also an electrical component that is inserted into the enclosure 12, as shown in FIGS. 1–2.) Specifically, walls 52 of the enclosure 12 will tear off the EMI reduction element 30 from the electrical component 10. To prevent this, pursuant to aspects of the invention, a protection element 54, which is described below, is used in conjunction with the EMI reduction element 30.

The protection element 54 has a variety of embodiments and is designed to contact the walls 52 of the enclosure 12 prior to the reduction element 30 when the electrical component 10 is inserted into (direction shown by arrow 48) and/or removed from (direction shown by arrow 50) the enclosure. When the enclosure walls 52 contact the protection element 54, the protection element 54 deflects the walls 52 away from the portion 56 (FIG. 5) of the reduction element 30 that is secured to the electrical component 10. The walls 52 are instead guided up the protection element 54 and then contact the reduction element 30 in a manner that will not tear and/or shear the reduction element, but will still contact the reduction element for proper grounding.

Figure 5:
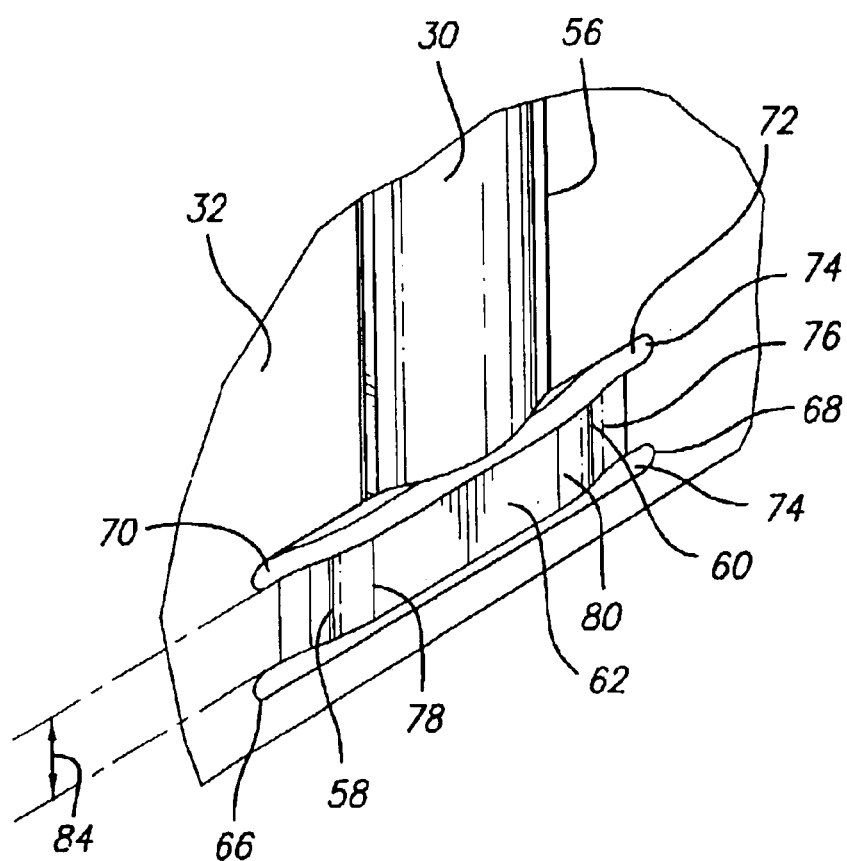
FIG. 5 is an enlarged isometric view of a portion of FIG. 1 showing a protection element of the invention, and a portion of an EMI reduction element.

As shown in FIG. 5, the protection element 54 includes proximal 58 and distal 60 portions that are integral with a middle portion 62. The middle portion 62 has a maximum height 64 (FIG. 4a), and the proximal 58 and distal 60 portions have proximal 66 and distal 68 ends, respectively. The protection element 54 can be comprised of a variety of materials, such as, for example, plated plastic, sheet metal or die-cast magnesium. In a preferred embodiment, the protection element 54 is comprised of sheet metal.

The middle portion 62, proximal 58 and distal 60 portions will be described first, and the positioning of the protection element 54 on the electrical component 10 will be described second. The maximum height 64 of the middle portion 62, shown in FIG. 4a, is based on the height 42 of the EMI reduction element 30, so that the middle portion 62 prevents tearing and shearing of the reduction element 30 by the enclosure walls 52. Specifically, a maximum height 64 is chosen to prevent the walls 52 of the enclosure 12 from contacting that portion 56 (FIG. 5) of the reduction element 30 that is secured to the electrical component 10. The maximum height 64 also cannot be too high so as to prevent contact of the reduction element 30 with the enclosure 12. In one embodiment, the maximum height 64 is about 30% to about 50% of the EMI reduction element height 42, and in the preferred embodiment, the maximum height 64 is about 50% of the reduction element height 42.

In one embodiment of the protection element 54, the proximal 58 and distal 60 portions each have a top edge 70,72 that forms an angle with the outer surface 32 of the electrical component 10. Note that the protection element 54 can have many forms and shapes such as one having two top rails 74 that form an angle with the outer surface 32. The rails 74 are integral with a top surface 76 that is depressed between the two rails 76, as shown in FIG. 5. In other embodiments, there can simply be a top surface that forms an angle with the outer surface of the electrical component.

As shown in FIG. 4a, the angle causes a height of the proximal 58 and distal 60 portions of the protection element 54 to increase from the proximal 66 and distal 68 ends of the protection element, at which point the height is less than the maximum height 64 and can be as little as zero inches. The height of the proximal 58 and distal 60 portions is increased to about the maximum height 64 while approaching inner sections 78, 80 of the proximal 58 and distal 60 portions. The rate at which the heights of the proximal 58 and distal 60 portions increase is dependent on the angle between the top edge 70, 72 of the proximal and distal portions and the outer surface 32 of the electrical component. In one embodiment the angle is within a range of about 30° to about 50°, and in the preferred embodiment, the angle is about 45°.

In the preferred embodiment, where the top edges 70, 72 of the proximal 58 and distal 60 portions form an angle of about 45° with the outer surface 32 of the electrical component 10, the proximal and distal portions have a length that is about equal to the maximum height 64. The length of the distal portion 60 is from the distal end 68 to about the inner section 80 of the distal portion 60, and the length of the proximal portion 58 is from the proximal end 66 to about the inner section 78 of the proximal portion 58.

The increase in the height of the proximal 58 and distal 60 portions to the maximum height at an angle causes the walls 52 of the enclosure 12 to be gradually deflected up along the top edge 72 of the distal portion 60, during electrical component 10 insertion, and up along the top edge 70 of the proximal portion 58, during electrical component removal. The enclosure walls 52 are gradually deflected to the maximum height 64, facilitating the insertion and removal of the electrical component 10 from the enclosure 12 as a sharp increase in height may impede the insertion and removal of the electrical component from the enclosure.

Positioning of the protection elements 54 is discussed next. In one embodiment, the protection element 54 is positioned on the electrical component 10 to prevent undesirable shearing or tearing of the reduction element 30 when the electrical component is inserted (direction shown by arrow 48) into the enclosure 12. In this embodiment, the protection element 54 is positioned adjacent to the reduction element 30 and positioned so that the middle portion 62 is closer to the distal end 28 of the electrical component 10 than the distal side 36 of the reduction element 30. This prevents the enclosure 12 from shearing or tearing off the EMI reduction element 30 from the electrical component 10 when the electrical component is inserted (direction shown by arrow 48) into the enclosure. In another embodiment, the protection element 54 is positioned so that the middle portion 62 is closer to the proximal end 26 of the electrical component 10 than the proximal side 34 of the reduction element 30, preventing shearing when the electrical component is removed (direction shown by arrow 50) from the enclosure 12.

In the preferred embodiment shown in FIGS. 4a and 5, the middle portion 62 has a length 82 that is about the same as the width 44 of the reduction element 30, or longer. Note that, if a reduction element 30 having proximal and distal sides that are not parallel is used, there would be different widths at different points along the proximal and distal sides. The length 82 of the middle portion 62 would be greater than the longest width of the reduction element.

In the preferred embodiment, the middle portion 62 is positioned so that the middle portion is closer to the distal 28 and proximal 26 ends of the electrical component 10 than the distal 36 and proximal 34 sides of the reduction element 30, respectively. Specifically, in the preferred embodiment, the protection element 54 is positioned axially adjacent to the reduction element 30. In the horizontal orientation of the enclosure 12 and electrical component 10 shown in FIG. 3, a protection element 54 is positioned above the first side 38 of the reduction element 30 and another is positioned below the second side 40 of the reduction element 30. On the other hand, if the enclosure and electrical component were in a vertical orientation (not shown), a protection element would be positioned to the right of the first side, and another protection element would be positioned to the left of the second side. In this manner, the protection element 54 of the preferred embodiment prevents shearing or tearing of the reduction element 30 by the enclosure 12 during both insertion and removal of the electrical component 10 from the enclosure 12.

The length 82 of the middle portion 62 and the placement of the protection element 54, in the preferred embodiment, allow the middle portion 62 to contact the enclosure walls 52 before the reduction element 30 when the electrical component 10 is inserted into (direction shown by arrow 48) and removed from (direction shown by arrow 50) the enclosure 12.

To allow for effective prevention of shearing and tearing of the reduction element 30, in the preferred embodiment, there is one EMI reduction element 54 per every ten inches, in length 46, of the reduction element 30. Note that, if a reduction element having proximal and distal sides that are not parallel is used, there would be different lengths at different points along the first and second sides. The length used for determining the ten inches would be the longest length of the reduction element.

In a preferred embodiment of the protection element 54, the protection element has a width 84 (FIG. 5) that is about twice the distance of the maximum height 64 of the protection element 54. The preferred embodiment of the protection element 54 incorporates such a width 84 because protection elements having such dimensions are easier to manufacture.

Having thus described a preferred embodiment of an electrical assembly, it should be apparent to those skilled in the art that certain advantages of the within system have been achieved. It should also be appreciated that various modifications, adaptations, and alternative embodiments thereof may be made within the scope and spirit of the present invention. For example, an electrical assembly in a horizontal orientation has been illustrated, but it should be apparent that the inventive concepts described above would be equally applicable to electrical assemblies in other orientations, such as, vertical orientations. The invention is further defined by the following claims.

What is claimed is:

1. An electrical assembly, comprising:
    an electrical component including a distal end;
    an EMI reduction element having a height and a distal side, the EMI reduction element secured to the electrical component;
    at least one protection element, the at least one protection element including a middle portion having a maximum height, the maximum height being based on the height of the EMI reduction element, and the maximum height being about 30% to about 50% of the reduction element height, wherein the at least one protection element is secured to the electrical component and is positioned adjacent to the EMI reduction element so that a distance between the middle portion and the distal end of the electrical component is less than a distance between the distal side of the EMI reduction element and the distal end of the electrical component.

2. The electrical assembly of claim 1, wherein the at least one protection element includes proximal and distal portions integral with the middle portion, the proximal portion and the distal portions each having a top edge forming an angle between the top edge and an outer surface of the electrical component.

3. The electrical assembly of claim 1, further comprising an enclosure, wherein the electrical component is positioned within the enclosure and the EMI reduction element abuts the enclosure.

4. The electrical assembly of claim 1, wherein the reduction element comprises beryllium copper fingers and has a "D" cross-sectional shape.

5. The electrical assembly of claim 1, wherein the protection element has a width at least twice as long as the maximum height of the middle portion.

6. An electrical assembly, comprising:
    an electrical component including a distal end;
    an EMI reduction element having a height and a distal side, the EMI reduction element secured to the electrical component;
    at least one protection element, the at least one protection element including a middle portion having a maximum height and proximal and distal portions integral with the middle portion, the proximal portion and the distal portions each having a top edge forming an angle, within a range of about 30 degrees to about 50 degrees, between the top edge and an outer surface of the electrical component, the maximum height being based on the height of the EMI reduction element, wherein the at least one protection element is secured to the electrical component and is positioned adjacent to the EMI reduction element so that a distance between the middle portion and the distal end of the electrical component is less than a distance between the distal side of the EMI reduction element and the distal end of the electrical component.

7. The electrical assembly of claim 6, further comprising an enclosure, wherein the electrical component is positioned within the enclosure and the EMI reduction element abuts the enclosure.

8. The electrical assembly of claim 6, wherein the protection element has a width at least twice as long as the maximum height of the middle portion.

9. An electrical assembly, comprising:
    an electrical component including a distal end;
    an EMI reduction element of less than about ten inches in length, and having first and second sides, a height, and a distal side, the EMI reduction element secured to the electrical component;
    at least one protection element, the at least one protection element including a middle portion having a maximum height, the maximum height being based on the height of the EMI reduction element, wherein the at least one protection element is secured to the electrical component and is positioned adjacent to the EMI reduction element so that a distance between the middle portion and the distal end of the electrical component is less than a distance between the distal side of the EMI reduction element and the distal end of the electrical component, and one of the at least one protection elements being positioned axially adjacent to the first side of the reduction element, and another of the at least one protection elements being positioned axially adjacent to the second side of the reduction element.

10. The electrical assembly of claim 9, wherein the at least one protection element includes proximal and distal portions integral with the middle portion, the proximal portion and the distal portions each having a top edge forming an angle between the top edge and an outer surface of the electrical component.

11. The electrical assembly of claim 9, further comprising an enclosure, wherein the electrical component is positioned within the enclosure and the EMI reduction element abuts the enclosure.

12. The electrical assembly of claim 9, wherein the protection element has a width at least twice as long as the maximum height of the middle portion.

13. An electromagnetic interference (EMI) reduction system for use with an electrical component having distal and proximal ends, comprising:

an EMI reduction element secured to the electrical component, the EMI reduction element having a height and a proximal side;

at least one protection element having a middle portion, the middle portion having a maximum height, and the maximum height being based on the height of the EMI reduction element and being about 30% to about 50% of the reduction element height, wherein the at least one protection element is secured to the electrical component and is positioned so that a distance between the middle portion and the proximal end of the electrical component is less than a distance between the proximal side of the EMI reduction element and the proximal end of the electrical component.

14. The electrical assembly of claim 13, wherein the protection element includes proximal and distal portions integral with the middle portion, the proximal portion and the distal portions each having a top edge forming an angle between the top edge and an outer surface of the electrical component.

15. An electromagnetic interference (EMI) reduction system for use with an electrical component having distal and proximal ends, comprising:

an EMI reduction element secured to the electrical component, the EMI reduction element having a height and a proximal side;

at least one protection element having a middle portion and proximal and distal portions integral with the middle portion, the proximal portion and the distal portions each having a top edge forming an angle, within a range of about 30 degrees to about 50 degrees, between the top edge and an outer surface of the electrical component, the middle portion having a maximum height, and the maximum height being based on the height of the EMI reduction element, wherein the at least one protection element is secured to the electrical component and is positioned so a distance between the middle portion and the proximal end of the electrical component is less than a distance between the proximal side of the EMI reduction element and the proximal end of the electrical component.

16. An improved electrical assembly of the type in which an EMI reduction element having a height and a distal side is secured to an electrical component having a distal end, wherein the improvement comprises:

at least one protection element having a middle portion and proximal and distal portions integral with the middle portion, the proximal portion and the distal portions each having a top edge forming an angle, within a range of about 30 degrees to about 50 degrees, between the top edge and an outer surface of the electrical component, the middle portion having a maximum height that is based on the height of the reduction element, wherein the at least one protection element is secured to the electrical component and positioned adjacent to the EMI reduction element so that a distance between the middle portion of the at least one protection element and the distal end of the electrical component is less than a distance between the distal side of the EMI reduction element and the distal end of the electrical component.

17. The improved electrical assembly of claim 16, wherein the at least one protection element is positioned axially adjacent to the reduction element.

18. The improved electrical assembly of claim 16, wherein the protection element has a width at least twice as long as the maximum height of the middle portion.

19. An improved electrical assembly of the type in which an EMI reduction element having a height and a distal side is secured to an electrical component having a distal end, wherein the improvement comprises:

at least one protection element having a middle portion, the middle portion having a maximum height that is based on the height of the reduction element, the maximum height being about 30% to about 50% of the reduction element height, wherein the at least one protection element is secured to the electrical component and positioned adjacent to the EMI reduction element so that a distance between the middle portion of the at least one protection element and the distal end of the electrical component is less than a distance between the distal side of the EMI reduction element and the distal end of the electrical component.

20. The improved electrical assembly of claim 19, wherein the at least one protection element includes proximal and distal portions integral with the middle portion, the proximal portion and the distal portions each having a top edge forming an angle between the top edge and an outer surface of the electrical component.

* * * * *